United States Patent [19]

Merletti

[11] Patent Number: 5,466,923
[45] Date of Patent: Nov. 14, 1995

[54] METHOD AND CIRCUIT FOR COMPENSATING THE DRIFT OF THE OUTPUT SIGNAL OF A PHOTOELECTRIC SENSOR IN AN ELECTRICAL REMOTE CONTROL APPARATUS, AND REMOTE CONTROL APPARATUS REALIZING THIS METHOD AND THIS ARRANGEMENT

[75] Inventor: Didier Merletti, Mornant, France

[73] Assignee: Rexroth Sigma, Venissieux, France

[21] Appl. No.: 188,321

[22] Filed: Jan. 28, 1994

[30] Foreign Application Priority Data

Jan. 28, 1993 [FR] France .................................. 93 00879

[51] Int. Cl.$^6$ ................................................ H01J 40/14
[52] U.S. Cl. ............................ 250/214 PR; 250/214 C
[58] Field of Search ...................... 250/214 C, 214 PR, 250/231.19; 73/705, 708

[56] References Cited

U.S. PATENT DOCUMENTS 3,872,301  3/1975  Joppich .............................. 250/214 C Primary Examiner—Stephone B. Allen
Attorney, Agent, or Firm—Cushman, Darby & Cushman

[57] ABSTRACT

Method for compensating an output signal of a photoelectric sensor having a drift due to aging a drift in temperature and a signal in absence of optical excitation (dark signal), in an electrical proportional remote control apparatus of the manipulation or analog type comprising an actuation member or actuation part for progressive displacement functionally associated to at least one photoelectric sensor adapted to generate an electrical signal of which one parameter is representative for the displacement and/or the position of said actuation member.

47 Claims, 5 Drawing Sheets

METHOD AND CIRCUIT FOR COMPENSATING THE DRIFT OF THE OUTPUT SIGNAL OF A PHOTOELECTRIC SENSOR IN AN ELECTRICAL REMOTE CONTROL APPARATUS, AND REMOTE CONTROL APPARATUS REALIZING THIS METHOD AND THIS ARRANGEMENT

BACKGROUND OF THE INVENTION

1. Field of the Invention

This invention relates to the compensation of the drift of the output signal of a photoelectric sensor and, more particularly, to the compensation of the drift of the output signal of a photoelectric sensor included in a proportional electric remote control apparatus of the manipulation or analog type comprising sliding pressure sensors pairwise associated and selectively actuated by an actuation part or actuation member for progressive displacement, which each pressure is being functionally associated with a photoelectric sensor adapted to produce an electrical signal of which one parameter is representative of the displacement and/or position of the pressure sensor, and hence, of the actuation member.

2. Description of Related Art

The characteristics of the operation of a photoelectric sensor are subjected to an evolution which corresponds to two types of drifts.

A first cause of drift is imputed to variations of the ambient temperature. This drift can be very important, for instance, the drift of an electroluminescent diode (LED) can be in the range +40% to −60% around a nominal value when the temperature varies between −40° C. and +85° C.

A second cause of drift is imputed to aging of the constituents or components of the sensor. This aging depends on the materials used for the sensor or its constituents, or its fabrication, or the life of the sensor, and also, or the temperature, such that the evolution of the aging and the drift of the output signal of the sensor which results therefrom are difficult to foresee, as they are all characteristic of each sensor.

It is therefore necessary to proceed in a periodic manner with a recalibration, regauging, etc. . . . of a sensor to be in a position to know the true value of its output signal.

These considerations are of general character and apply to all types of photoelectric sensors, including sensors formed by a photoemitter/photoreceiver pair (for example photodiodes) between which a movable part with variable transparency is located. Thus it is possible to form a proportional remote control in which one parameter (for example the current amplitude or the voltage) of the output signal of the photoreceiver translates the displacement of a command part (for example a displaceable handle) in view of the command of a provided utilizing part.

In such a mounting, a drift of an output signal of the photoelectric sensor can be translated like a superposition of a true signal and a parasitic signal having the same effect as an actuation of the command part and can entrain a non-desired actuation of the provided utilizing part.

Hence it appears indispensable to assure a reliable command of the provided utilizing part to compensate the output signal of the photoelectric sensor essentially as a function of aging and of the temperature and equally in the measurement of other possible causes, and in particular regarding the appearance of a dark signal (output signal of the photoelectric sensor when it is not optically excited).

SUMMARY OF THE INVENTION

To this end, according to a first aspect, this invention is a method for compensating the output signal of a photoelectric sensor having a drift due to aging and a drift in temperature in a proportional electric remote control apparatus of the manipulation or analog type comprising an actuation member for progressive displacement functionally associated with at least one photoelectric sensor adapted to generate an electrical signal of which one parameter is representative of the displacement and/or the position of the actuation member. The method comprises the following steps:

Detecting a particular position of the actuation member allowing to be assured that the photoelectric sensor is not functionally activated by the actuation members (i.e., a neutral position).

Detecting the value of a signal that has a unique relationship to the output signal of the photoelectric sensor when it is not functionally activated or actuated by the actuation member (i.e., a detected value in the neutral position).

Comparing the detected value in the neutral position with an earlier detected value in the neutral position which was stored in a memory.

Deducing or extracting an updated correction factor for the sensor.

When the sensor is again functionally activated by a displacement of the actuation member, correcting, with the help of the updated correction factor, a signal of the sensor that has a unique relation to the output signal of the sensor in order to obtain an output signal that is compensated in an updated manner as a function of aging and of temperature.

The detection of the particular position of the actuation member can be effected in all appropriate manners that are known to those skilled in the art. For example, detecting the position can be by a micro-switch, by interrupting a light ray, etc., which can be realized in all types of proportional remote control apparatuses including those comprising only one output or an odd number of outputs that are associated with the actuation member. One can however, advantageously use a particular mounting when the proportional remote control apparatus comprises two or an even number of outputs, a configuration which corresponds to the largest number of proportional remote control apparatuses in practice.

Thus, in the case of a proportional electrical remote control apparatus of the manipulation or analog type comprising sliding pressure sensors pairwise associated and selectively actuated by an actuation member for progressive displacement, each pressure sensor being functionally associated with a photoelectric sensor adapted to generate an electrical signal of which one parameter is representative of the displacement and/or the position of the pressure sensor and hence of the actuation member, the photoelectric sensors pairwise associated with the respective pressure sensors are subjected to a mode of operation with opposite phases. When the actuation member is displaced in a given direction the actuation of a pressure sensor results therefrom and hence an excitation of the associated photoelectric sensor as long as at the same time the other pressure sensor is not activated and the other sensor associated with the latter is not excited.

This particular realization of the invention takes advantage of the provisory maintenance in the non-excited state of the other photoelectric sensor to detect the real state of its output in order to take into consideration when it is again excited because of a later displacement corresponding to the actuation member.

To this end and in this context the invention proposes a method to compensate an output signal of a photoelectric sensor having a drift due to aging and a drift in temperature in a proportional electrical remote control apparatus of the manipulation or analog type comprising sliding pressure sensors pairwise associated and selectively actuated from an actuation member for progressive displacement, each pressure sensor being functionally associated with a photoelectric sensor adapted to generate an electrical signal of which one parameter is representative of the displacement and/or the position of the pressure sensor and hence of the actuation member, the method comprising the following steps:

Detecting a minimum threshold of a signal that has a unique relation to the output signal of a first photoelectric sensor associated with one of the pressure sensors activated by a displacement of the actuation member.

Detecting the value of a signal that has a unique relation to an output signal of the second photoelectric sensor associated with the other pressure sensor which is not activated by the displaced actuation member (detected value in the neutral position).

Comparing the detected value in the neutral position with an earlier detected value in the neutral position which was stored in a memory.

Deducing an updated correction factor for the second sensor.

When the pressure sensor associated with the second sensor is, in turn, functionally activated by the displacement of the actuation member, correcting, with the help of the updated correction factor, the signal of the second sensor that has a unique relation to its output signal in a manner to obtain an output signal that is compensated in an updated manner as a function of aging and of the temperature.

Preferably, with the help of the updated correction factor, the detected value of the output signal itself of the sensor and the second photoelectric sensor, respectively, is corrected.

Advantageously the updated correction factor does not depend on the ratio of the earlier detected value in the neutral position which was stored in a memory to the detected value in a neutral position.

Further advantageously, the minimal threshold corresponds to a predetermined value, in particular about 50% of the dynamic of the output signal of the sensor, respectively, of the first sensor constituted by the difference of its stored maximum value, that in particular corresponds to the maximum displacement of the command part in the activating direction of the sensor and of its stored minimum value which in particular corresponds to a rest position of the command.

By the way, the drift of the output signal as a function of temperature for a sensor that is subjected to a reasonably homogeneous ambient temperature is approximately the same for all sensors of the same kind. It is therefore possible to provide to effect in a predictive manner, an approximate compensation alone of the thermal drift of the output signal of the photoelectric sensor and to effect only afterwards when the signal is approximately compensated in temperature, the above-mentioned compensation which compensates in this way globally the drift due to aging and only of the rest of the drift in temperature that was not taken into consideration in the approximative predictive compensation.

To this end, before one proceeds to the essentially above-described steps, the following steps are realized:

Determining a law of evolution of the drift of the output signal of at least one photoelectric sensor as a function of temperature, the law of evolution being considered as a typical law.

Establishing from the typical law and memorizing a law of evolution of an analog nominal value signal or compensation signal as a function of ambient temperature, and Regulating, with the help of the analog compensation signal, a signal of the photoelectric sensor that has a unique relation to the output signal of the sensor, the memorized law of evolution being chosen such that the evolution of the analog compensation signal as a function of temperature has such an absolute value or magnitude and such a sign that it is translated to a variation of the output signal of approximately the same absolute value and opposite sign to that imputed to the thermal drift.

Hence, the thermal drift of the output signal of the photoelectric sensor is approximately compensated in a predictive manner in order to obtain an output signal that is approximately thermally in a predictive manner compensated after that the further above-mentioned steps are realized.

In a realization of this method it is provided after having determined the typical law that:

establishing from the typical law and memorizing a law of correspondence between values of ambient temperature and values of the index or degree of width modulation of a periodic signal that is modulated in width, then, in the course of operation of the photoelectric sensor detecting of the ambient temperature into which the photoelectric sensor is inserted, generating a periodic signal that is modulated in width with the index of modulation selected in a memory in correspondence with the detected value of the temperature, gaining an analog compensation signal constituted by the mean value of the periodic signal that is modulated in width with the selected modulation in correspondence with the ambient temperature, and regulating with the help of the in this manner constituted analog compensation signal, a signal of the photoelectric sensor that has a unique relation to the output signal of the sensor.

In a practical case of the realization of that method, the excitation signal of the photoelectric sensor that has a unique relation to the output signal of the sensor is regulated with the help of the analog compensation signal and, more particularly, it is possible also to provide that the photoelectric sensor comprises a photoemitter and a photoreceiver that are optically coupled and that the excitation signal of the photoemitter is regulated to compensate predictively the output signal of the sensor.

Finally, another cause of an error of the output signal of the photoelectric sensor resides in the appearance of a signal (dark signal) in the absence of luminous excitation (absence of excitation by light) of the sensor. Particularly, it appears un non-zero current in the output of an optically not excited photoreceiver. There, this parasitic signal can be analyzed as producing the same effects as a displacement of the actuation member of the remote control apparatus and it is desirable to compensate it to annihilate the undesired effect.

To this end the invention proposes to follow the following steps:

interrupting the optical excitation of the photoelectric sensor, measuring the output signal (dark signal) of the not excited photoelectric sensor, memorizing the dark signal of the photoelectric sensor, and in the course of operation of the photoelectric sensor that is again optically excited, taking into consideration the dark signal to deduce the true output signal of the photoelectric sensor.

These steps that intend a compensation of the dark current can be realized accompanied by one or the other of the above-mentioned aspects of the method of the invention, such that the above-mentioned steps of compensating the drift are applicable to the output signal that is compensated in view of the dark signal, in order to obtain an output signal that is compensated in view of the drift due to aging and of temperature, eventually compensated in temperature in a predictive manner, and consideration having been given to the existence of the dark signal.

Particularly, in a very interesting manner, it can be envisaged to assure a complete compensation of the output signal of the photoelectric sensor comprising a photoemitter and a photoreceiver that are optically coupled, the complete compensation being characterized in that the output signal of the sensor is approximately thermally compensated in a predictive manner as indicated further above, further in that the such predictively compensated signal is compensated to take the existence of the dark current into consideration as indicated further above, and finally in that the signal is furthermore compensated in view of the drift due to aging and of a rest of thermal drift as indicated further above.

It can be noted that the different above-mentioned compensations can be effected in a completely automatic manner, after memorization of output data, during all the life of the remote control apparatus constituted in this manner. The update or reactualization of the compensation as a function of aging and of the temperature can intervene at each actuation of the command lever. The reactualization of the two other compensations can be effected in a cyclic manner at time intervals of the order of such short time intervals as the second or the millisecond, consideration having been given to the speed of the operation of today's electronic circuits (microprocessors), which can be used for the exploitation of the method according to the invention. Thus, it is assured that, no matter how rapid the variation of the parameters influencing the drift of the output signal is, that the signal will be efficiently compensated and that the utilizing remote control part has a reliable operation of the signal.

According to a second aspect, the invention proposes an electronic circuit for the compensation of an output signal of a photoelectric sensor having a drift due to aging and a drift due to temperature, in a proportional electrical remote control apparatus of the manipulation type or analogue type comprising an actuation member for progressive displacement functionally associated with at least one photoelectric sensor adapted to produce an electrical signal of which one parameter is representative of the displacement and/or the position of the actuation member, whereby the circuit arranged according to the invention is essentially characterized in that it comprises:

threshold means adapted to detect a particular position of the actuation member allowing to be assured that the photoelectric sensor is not functionally activated by the actuation member (positionally), detection means adapted to detect the value of a signal that has a unique relation to the output signal of the photoelectric sensor while it is not functionally activated by the command part (detected value in the neutral position), first memory means to store in a memory an earlier detected value by the detection means and being taken as a reference, determination means adapted to provide an updated correction factor for the second sensor from the detected value by the detection means while the threshold means have detected the above-mentioned thresholds and from the reference value of the memory means, second memory means adapted to memorize the updated correction factor, and first correction means placed under the dependance of the second memory means, adapted to correct a signal that has a unique relation with the output signal of the sensor with the help of the updated correction factor when the sensor is functionally activated by a suitable displacement of the actuation member such that the output signal of the sensor is in an updated manner compensated as a function of aging and of the temperature.

The above-mentioned threshold means can be constituted by all appropriate means for this end which are known by the man skilled in the art (micro-switch or microinterrupter, optical detector, etc.).

However, in a particular case (but regarding the number, the most important) of proportional remote control apparatuses comprising an even number of outputs it is advantageous to advantageously use the alternative operation of the two outputs to constitute the above-mentioned threshold means from the output which is not functionally activated by the actuation member.

To this end and in this context the invention proposes an electronic circuit for the compensation of an output signal of a photoelectric sensor having a drift due to aging and a drift due to temperature, in a proportional electrical remote control apparatus of the manipulation or analog type comprising sliding pressure sensors pairwise associated and selectively actuated from an actuation member for progressive displacement, each pressure sensor being functionally associated with a photoelectric sensor adapted to produce an electrical signal of which one parameter is representative of the displacement and/or the position of the pressure sensor and hence of the actuation member, the circuit being constituted according to the invention is essentially characterized in that it comprises:

threshold means adapted to detect a minimum threshold of a signal that has a unique relation to the output signal of a first sensor associated with a first of the pressure sensors when the latter is actuated by a displacement of the actuation member, detection means adapted to detect the value of a signal and has a unique relation to the output signal of the second photoelectric sensor associated with the second pressure sensor (detected value in a neutral position), first memory means to store an earlier detected value in the neutral position by the detection means and being taken as a reference in a memory, determination means adapted to provide an updated correction factor for the second sensor from the detected value by the detection means when the threshold means have detected the threshold and from the reference value of the memory means, second memory means adapted to memorize the updated correction factor, and first correction means, placed under the dependence of the memory means, adapted to correct a signal that has a unique relation to the output signal of the second sensor with the help of the updated correction factor when the second pressure sensor associated with the second sensor is, in turn, functionally activated by a displacement of the actuation member, such that the output signal of the second sensor is compensated in an updated manner as a function of aging and of the temperature.

Preferably, the input of the first correction means is connected to the output of the detection means of the output signal of the photoelectric sensor (correction in the open loop).

Advantageously, the determination means of the updated correction factor comprises calculating means adapted to calculate the ratio of the earlier detected value stored in a memory in the first memory means to the detected value in the neutral position.

As each photoelectric sensor is subjected to an ambient temperature that is reasonably homogeneous, it can be furthermore provided that the detection means of the output signal of the photoelectric sensor comprises approximate and predictive thermal compensation means comprising:

third memory means adapted to memorize a law of evolution of an analog compensation signal as a function of the ambient temperature established from a typical law of evolution of the drift of the output signal of a sample photoelectric sensor as a function of the temperature, and second correction means placed under the dependence of the treating means, adapted to correct with the analog compensation signal a signal that has a unique relation to the output signal of the sensor, the stored or memorized law of correspondence having been chosen in a manner that the evolution of the analog compensation signal as a function of temperature has an absolute value and the sign such that it is translated into a variation of the output signal of the sensor of approximately the same absolute value and opposite sign to that is imputed to the thermal drift, in order to obtain an output signal of the sensor which is thermally in a predictive manner compensated.

In a preferred embodiment or mode of realization the approximate and predictive thermal compensation means comprises:

the third memory means adapted to memorize couples of values of ambient temperature and values of the index of width modulation of a periodic signal that is modulated in width established from a typical law of evolution of the drift of the output signal of a sample photoelectric sensor as a function of the temperature, detection means of the temperature adapted to detect the ambient temperature in which the photoelectric sensor is inserted, selection means of an index of modulation placed under the dependence of the detection means of the temperature and adapted to select in the third memory means a value of the index of modulation corresponding to a detected value of the ambient temperature, means for generating a periodic signal placed under the dependence of selection means of an index of modulation and adapted to produce a periodic signal that is modulated in width with the selected index of modulation, treating means adapted to provide an analog compensation signal constituted by the mean value of the periodic signal modulated in width in correspondence with the ambient temperature, and the second correction means that are placed under the dependence of the treating means.

In this case it is possible to provide that the second correction means act upon the excitation signal of the photoelectric sensor; in particular if the photoelectric sensor comprises a photoemitter and a photoreceiver that are optically coupled, the second correction means act upon the excitation current of the photoemitter to compensate predictively the output signal of the sensor.

It is also possible to provide that the detection means of the output signal of the photoelectric sensor comprises compensation means as a function of dark current comprising:

interruption or switch means of the optical excitation actuated when they are in operation to provoke an interruption of the optical excitation of the photoelectric sensor, fourth memory means to retain in the memory the value of the output signal of the sensor when the optical excitation of the sensor is interrupted (dark signal), and third correction means placed under the dependence of the fourth memory means, adapted to correct in a continuous manner the output signal of the photoelectric sensor that is again optically excited in the course of operation with the memorized value in order to provide an output signal that is in an updated manner compensated as a function of the dark signal.

In this case, preferably, interruption means of the excitation comprises electrical interruption means that are connected to the input of the electrical excitation of the sensor and advantageously the third correction means comprises subtraction means adapted to subtract continuously the memorized value of the dark signal from the instantaneous value of the output signal of the excited sensor, in operation.

It is also possible to construct the electronic circuits such that a complete compensation of the drifts of the output signal of the photoelectric sensor as a function of aging, of the temperature and of the dark signal is assured; in this case the circuit comprises in combination:

the predictive thermal compensation means connected such that a predictive compensation in temperature of the output signal of the photoelectric sensors is assured, the compensation means as a function of a dark signal in a manner to receive the thermally in a predictive manner compensated signal, and the compensation means as a function of aging and of the rest of the drift in temperature connected to the output of the preceding ones.

It is interesting to make the circuit according to the invention highly performing while it remains as compact as possible, to use the available components in the modern electronics and to provide in combination the following dispositions to realize a circuit of complete compensation which is characterized in that it comprises:

a microprocessor associated with at least one read only memory containing initial data and with at least a random access memory containing updated evolutionary data, detection means of the temperature comprising at least one temperature sensor connected to at least one input of the microprocessor, respective outputs of the photoelectric sensor connected respectively with two other inputs of the microprocessor, two excitation inputs, respectively of the two photoelectric sensors that are connected to a common excitation output of the microprocessor, interruption means adapted to make the two excitation inputs of the two photoelectric sensors, respectively, that are connected to a common command output of blocking of the microprocessor, conducting or non-conducting, and two outputs of the microprocessor delivering respectively output signals that are completely compensated associated with the two sensors.

Advantageously, the following can be further realized:

the excitation of the microprocessor delivers the periodic signal that is modulated in width as a function of the temperature, this output is connected to a filter circuit constituting the detection means of the mean value, and the output of the filter circuit is connected to two respective inputs of the two additional circuits of which the two other inputs respectively receive signals representative of excitation currents respectively are the photoelectric sensors and of which the respective outputs are connected to the respective excitation inputs of the two photoelectric sensors.

BRIEF DESCRIPTION OF THE DRAWINGS

The invention will be better understood after having read the detailed description of its specific embodiments that are only given as illustrative examples. In this description reference is taken to the appended drawings in which.

DETAILED DESCRIPTION OF PRESENTLY PREFERRED EXEMPLARY EMBODIMENTS

Figure 1:
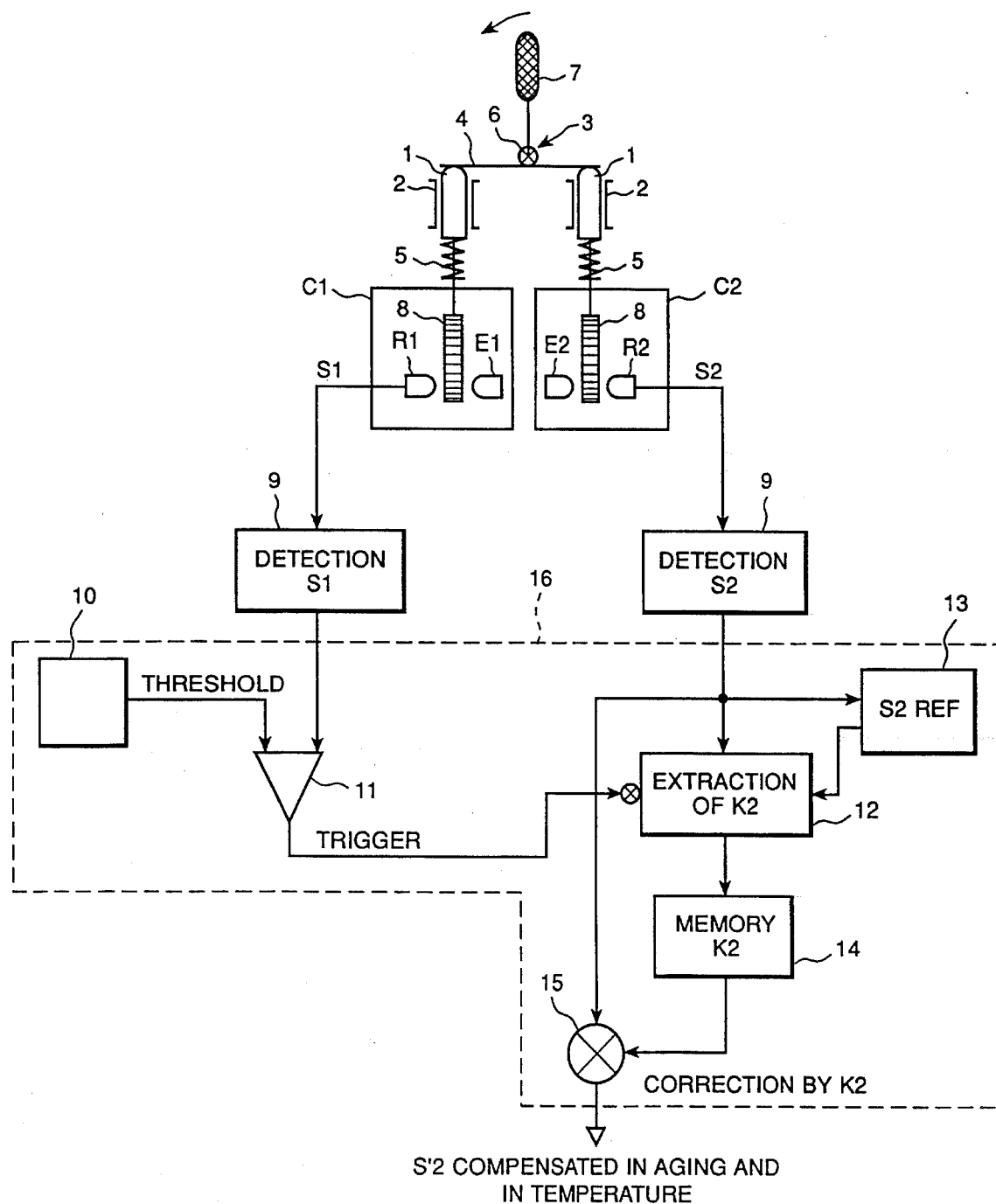
FIG. 1 illustrates a compensation circuit of the drifts due to aging and of a drift in temperature that is activated according to the invention.

Referring first to FIG. 1, a proportional electrical remote control apparatus of the manipulation or analog type (for example actionable with the foot or in a completely different fashion) is illustrated comprising sliding pressure sensors 1 in respective drill guidance holes 2 and pairwise associated. The pressure sensors 1 are selectively actuated from an actuation member 3 comprising a cam 4 against which the pressure sensors are biased by springs 5, the cam 4 being able to pivot around an axis 6 by manual actuation of a handle 7 for selectively putting down one or the other of the pressure sensors 1. Each pressure sensor 1 is functionally associated with a photoelectric sensor C1, C2 which is adapted to produce an electrical output signal S1, S2 of which one parameter (for example the current amplitude) is representative of the displacement and/or the position of the corresponding pressure sensor. For example, as illustrated, each pressure sensor 1 (2) is mechanically connected to a film or screen 8 with variable opacity or transparency (for example maximum opacity in the rest position or neutral position as represented in FIG. 1) interposed between a photoemitter E1, E2 (for example photo-emitting diode such as LED) and a photoreceiver respectively R1, R2 (for example a photoreceiver diode) disposed face-to-face. Each ensemble of a photoemitter E1, E2 and of a photoreceiver R1, R2, respectively and of a movable film 8 constituting a photoelectric sensor C1, C2, respectively.

The output signal S1 as S2 of the sensor C1 as C2 is first applied to detection means 9 that can be constituted by a simple circuit of formation of the signal, but which can also be activated in a more complex form as that will be indicated below.

To effect compensation of a drift due to aging and complete a partial drift in temperature of the output signals S1, S2, comparable values of the signals have to be detected. To this end measurements have to be effected or carried through when the sensors are in identical excitation conditions that are reproducible in time. This condition is fulfilled when the sensor to be tested is in the neutral position (i.e., where there is no excitation signal).

That detection of the necessary condition can be effected with a classic detection means of the position (micro switch or micro interrupter, optical detection of position, etc.) cooperating with the actuation member or with the movable parts (pressure sensor 1 (2) and/or film 8) functionally associated with the actuation member. This solution has to be retained in particular when the remote control apparatus only comprises one output or an odd number of outputs.

On the contrary, when the remote control apparatus comprises two outputs or an even number of outputs in the following manner, advantage can be taken of a functional particularity of this type of apparatus.

Having given consideration to the particularities of the mounting of the remote control apparatus considered according to the invention, it is assured that one of the sensors (for example C2) is in a neutral position when the other sensor, in this case C1, is excited, a condition which is satisfied when it is detected that the output signal S1 of the sensor C2 has surpassed a predetermined threshold. As a security measurement this minimum threshold can correspond to a predetermined value (for example 50%) of the dynamic of an output signal S1 constituted by the difference of its stored or memorized maximum value and its stored minimum value.

In these positions, when the actuation member 3 is displaced, for example, to the left in FIG. 1, the determination means of the threshold 10 provides information of the threshold to a comparator 11 also receiving the signal S1 provided by the detection means 9 of the signal S1.

The comparator 11 produces a trigger signal or a signal of authorization which is supplied to a command input of the determination or calculating means 12 that receive, on the one hand, the output signal of the means of the detection 9 of the signal S2 stemming from the sensor C2 and, on the other hand, an earlier value of the signal S2 (for example the initial value of this signal since the start of the operation of the remote control apparatus) which is stored in a memory 13 in a definite manner (for example a read only memory) and which serves from there on as a reference value.

The determination means 12 elaborate an updated correction factor K2, for example by calculating the ratio of the reference value stored in a memory to the valid detected value in the neutral position. The value of the updated correction factor K2 is then stored in a memory 14 (for example a random access memory).

When finally the actuation means are actuated in the course of operation in the inverse direction (to the right in FIG. 1), and act upon pressure sensor 1 corresponding to making the sensor C2 active, the comparator 11 associated with the sensor C1 is no longer activated and no longer provides the trigger signal. Hence the already detected value K2 is stored in a memory in the memory means 14 (for example a random access memory) and applied to the correction means 15 that receive, among other signals, a signal representative of the output signal of the sensor. In the illustrated example the signal in question is directly the output signal of the means of the detection 9 of the signal S2 (correction in the open loop). Thus, the correction means deliver a signal S'2 that is compensated in an updated manner (for example the coefficient K2 can be reevaluated each time that an appropriate manipulation of the actuation means 3—to the left in FIG. 1—makes the sensor C1 active) as a function of aging of the sensor C2 and of the ambient temperature.

The ensemble of the circuit situated under the detection means 9 of the signal S2 is designated globally by the reference sign 16 in FIG. 1.

It can here be noted that it is also possible to correct with the help of the correction means 15 not directly the output signal of the sensor C2 but a signal that has a unique relationship to this output signal. In particular the excitation signal of the photoemitter E2 can be corrected such that the output signal S2 stemming from the photoreceiver R2 is conveniently compensated.

Of course, the two sensors C1 and C2 play symmetric roles, one in view of the other, and the output signal of the sensor C2 is used to assure that the sensor C1 is in the neutral position in view of a corresponding updated correction factor K1. A symmetric circuit to the one shown in FIG. 1 is therefore provided for the compensation of the output signal S1 of the sensor C1.

In the case in which each sensor C1, C2 is placed in surroundings with homogeneous temperature (photoemitter El, E2, photoreceiver R1, R2 and films 8, respectively subjected to the same temperature), a predictive correction of the drift of the output Signal S1, S2 as a function of variations in the temperature can be envisioned.

Figure 2:
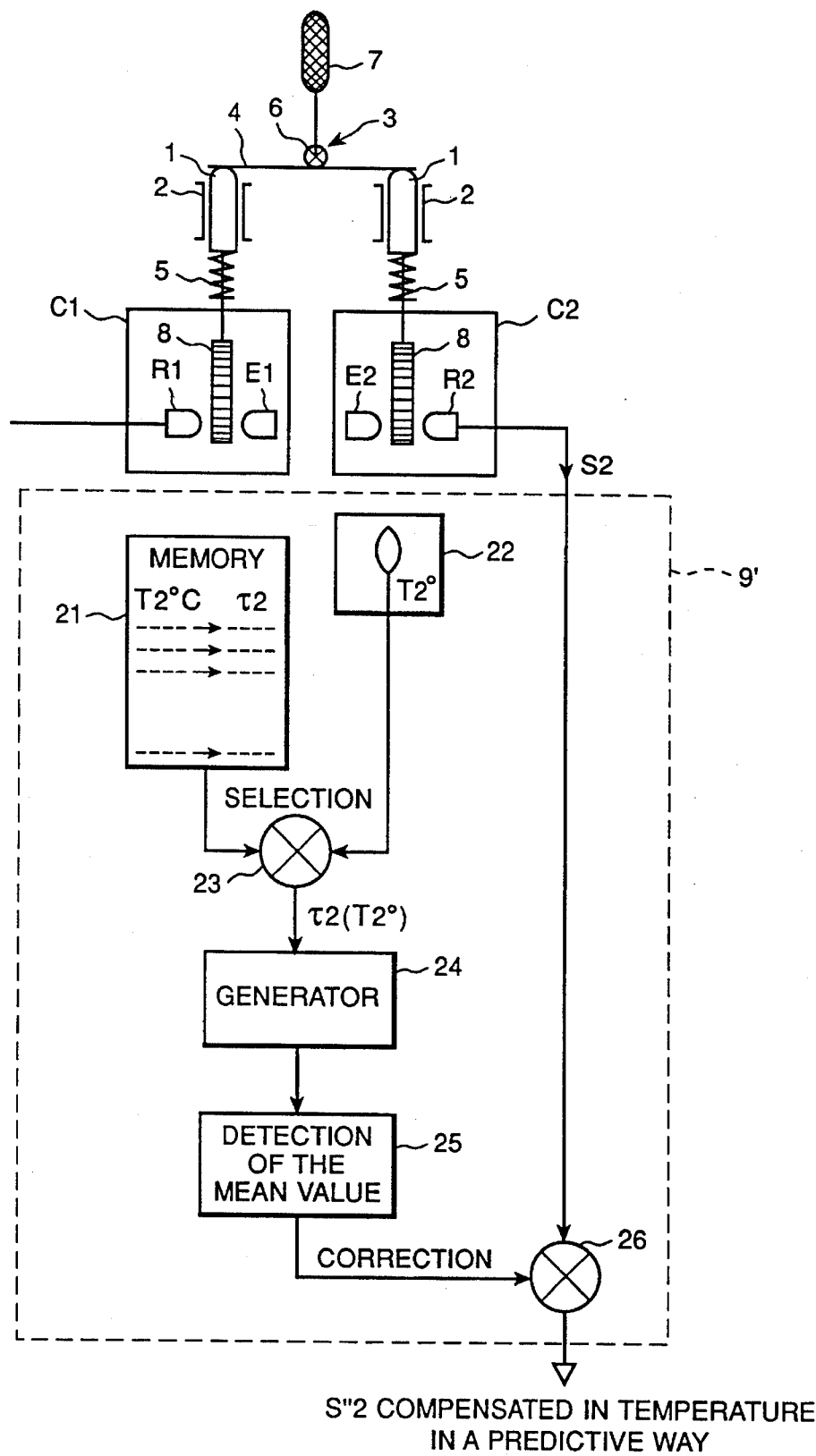
FIG. 2 illustrates an embodiment of a circuit of a predictive compensation of the drift in temperature being able to constitute a part of the circuit of FIG. 1.

A predictive thermal compensation circuit of the output signal S2 of the sensor C2 is illustrated in FIG. 2 where it is understood that an identical circuit must be associated also with the sensor C1.

For the realization of that predictive compensation one starts by establishing a law of evolution of the drift of the output signal of a sensor or a sample photoelectric sensor as a function of the temperature from a set law of evolution being taken as a typical law for all used sensors. From this typical law, a law of evolution of an analog compensation signal as a function of ambient temperature is established and memorized from which a signal of the sensor is regulated to obtain the desired compensation of its output signal.

In a practical example, which seems to be particularly interesting to realize, the following is carried through to this end. From this typical law pairs of values of ambient temperature T2° C. and values of the index τ2 of the modulation in width of a periodic signal that is modulated in width are established and memorized in the memory means 21 (for example a read-only memory), the pairs of values constituting a law of correspondence established after the typical law.

Means for detection of the temperature 22 are also realized, for example constituted around a resistor with variable temperature coefficient, in particular a negative coefficient (NTC), that detects, in a continuous fashion, the ambient temperature T2 to which in a homogeneous fashion the sensor C2 is subjected.

Selection means 23 functionally connected to the memory means 21 and to the detection means of the temperature 22 select in the memory means 21 the value of the index of width modulation τ2 that was earlier associated with the detected value of the temperature T2.

The index of modulation τ2(T2) that is in this way selected is applied to the width modulation input of a generator 24 of a periodic signal, in particular a rectangular signal, by which the periodic output signal is modulated in width in correspondence with the detected value of the temperature.

Thanks to the detection means 25, in particular constituted by a filter circuit for example of the RC-type, the mean value of the output signal of the generator 24 that constitutes an analog compensation signal of which the evolution is representative of the variations of the ambient temperature is detected.

This analog compensation signal is then applied to an input of regulation of the correction means 26 receiving among others a signal of the photoelectric sensor C2 that has a unique relation to its output signal S2, the memorized law of correspondence having been chosen in a manner that the evolution of the analog compensation signal as a function of temperature has an absolute value and a sign such that it is translated, in particular via the correction means 26 into a variation of the output signal of the sensor of approximately the same absolute value and opposite sign to the variation that is imputed to the thermal drift.

In the example, illustrated in FIG. 2, the correction means 26 receive in its main input the output signal S2 of the photoelectric sensor C2 and, hence, this is the output signal S2 itself that is directly corrected into a signal S"2 approximately compensated in a predictive manner in the temperature (compensation in the open loop).

The assembly of the predictive thermal compensation circuit can constitute detection means 9 of the signal S2 that have been mentioned further above regarding the FIG. 1 and are designated by the reference sign 9' in FIG. 2.

Figure 4:
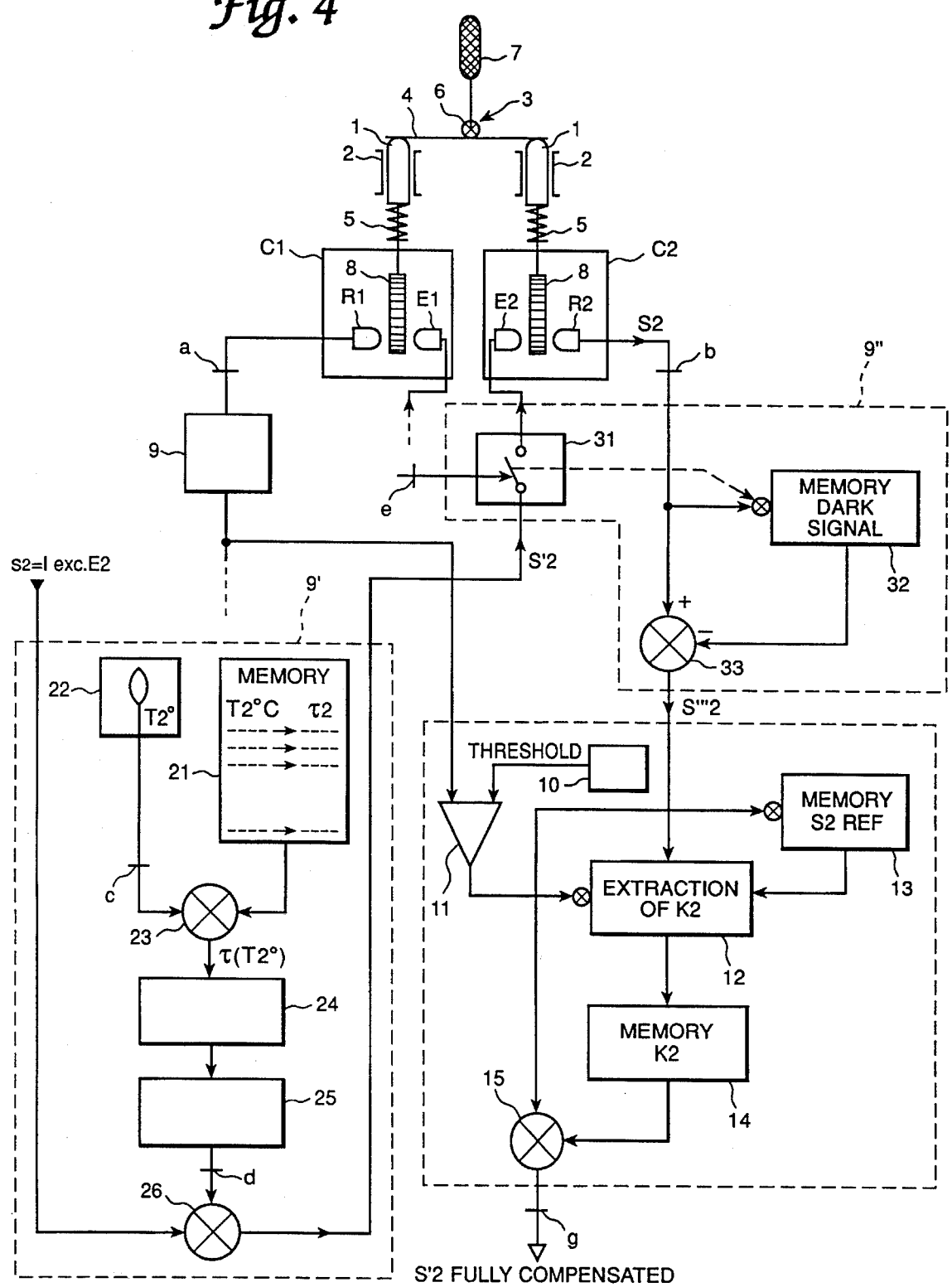
FIG. 4 illustrates a circuit of complete compensation of the drifts, including a variation of the predictive compensation of the drift in temperature, a compensation of the drift due to aging and of the rest of the thermal drifts according to FIG. 1 and a compensation of the dark signal according to FIG. 3.

Of course, it is also possible to use a correction or the compensation in a closed loop, of which an example based on a circuit analog to the above described is given further down in correspondence with FIG. 4.

The compensation of the thermal drift obtained with the help of the circuit of FIG. 2, being predictive, cannot be rigorous at each moment of operation of the manipulator. It is therefore the task of the compensation circuit of FIG. 1 described earlier, to perfect, in an instantaneous manner, the compensation of the rest of the thermal drift that has not been taken into consideration by the circuit of FIG. 2.

Figure 3:
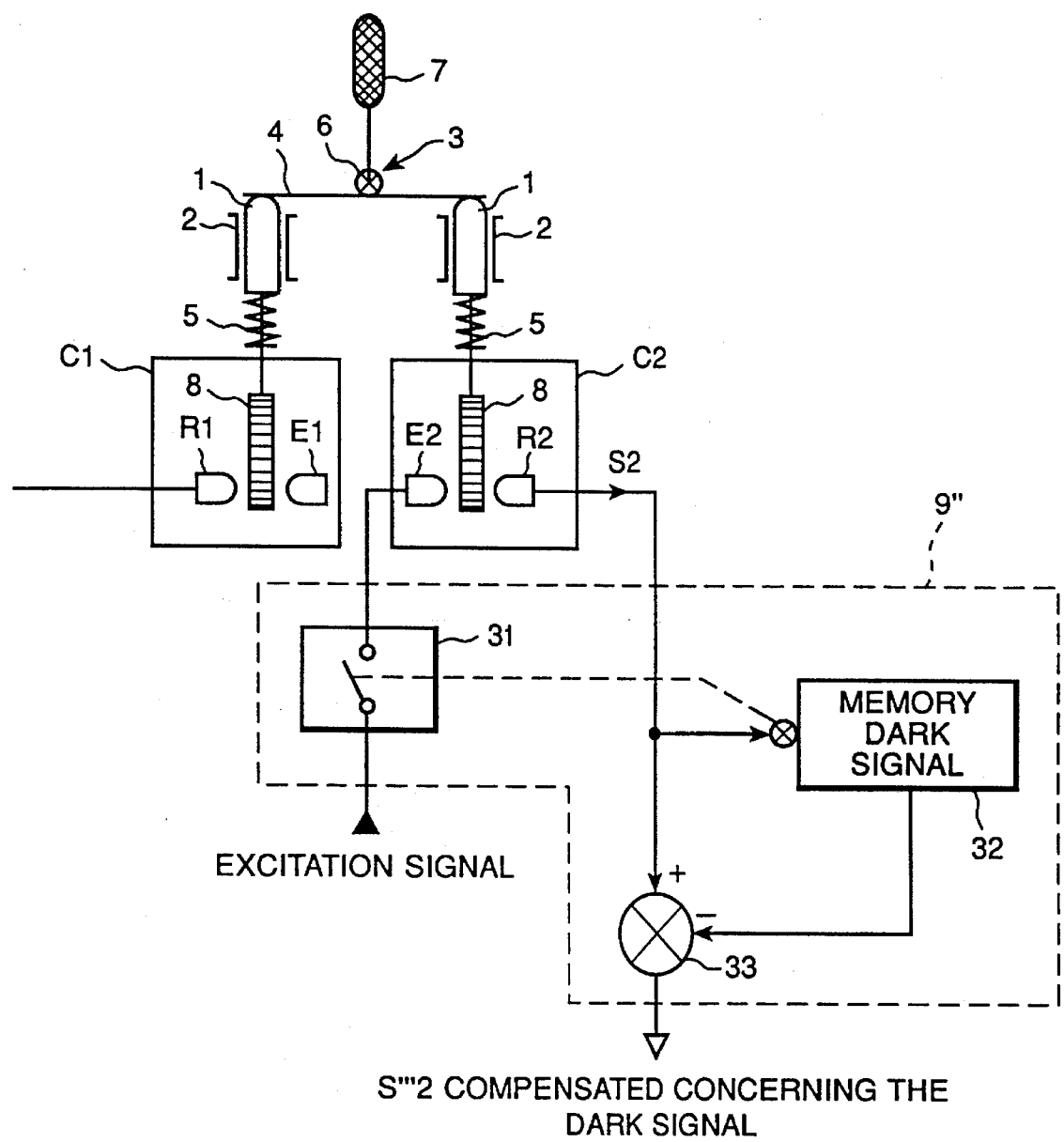
FIG. 3 illustrates a circuit of the compensation of a dark signal being able to constitute a part of the circuit of FIG. 1.

The appearance, in the output of the photoelectric sensor, of a signal in the absence of a luminous excitation constitutes another possible cause for an error for the output signal of the sensor in the course of operation. Thus, it is desirable to determine the value of the parasitic signal (dark signal) and to subtract it from the output signal to obtain the true value of the latter. To do this, as illustrated in FIG. 3, one provokes an interruption of the luminous excitation of the sensor C2. In a practical manner the electric excitation at the input is interrupted and to this end the opening of the interruption means 31 inserted in the excitation line of the photoemitter E2 is provided. In correlation to this interruption of the optical excitation of the photoreceiver R2, a value of the residual signal (or dark signal) is entered into the memory in the memory means 32 (for example random-access memory).

Then, in the course of operation of the manipulator, when the photoemitter C2 is again excited through the closed interruption means 31, the output signal S2 of the sensor C2 is applied to the correction means 33 that receives among others, the stored or memorized value of the dark signal. The correction means 33 are in practice subtraction means, receiving the signal S2 in a non-inverted input (+) and memorized value of the dark signal in an inverted input (−). The output signal S2 of the sensor therefore compensated in view of the dark signal.

Of course, it can be envisioned to use the value of the dark signal in this way detected to assure a correction not directly of the output signal of the sensor, but of a signal (for example excitation signal of the photoemitter) that is in a unique manner related to it.

In providing at regular intervals a memorization cycle of the instantaneous value of the dark signal, an updated correction of the output signal of the sensor can be obtained.

The assembly of the compensation circuits in view of the dark signal can constitute the detection means 9 of the signal S2 that were mention further above with respect to FIG. 1 and is designated with the new reference sign 9" in FIG. 3.

In practice, when the photoelectric sensor C1, C2 are not disposed in surroundings with constant temperature (thermostatic isolation) a correct operation of the manipulator implies that the output signal of each sensor is subjected to the three above mentioned compensations. FIG. 4 represents a complete electronic circuit combining the three above individually described once, to assure the total compensation of the output signal S2 of the sensor C2, whereby it is understood that an analog circuit is provided for the total compensation of the output signal S1 of the sensor C1. In FIG. 4 alpha-numeric reference symbols have been retained like those already used in FIGS. 1, 2 and 3.

However, regarding more precisely in the practical case in which each sensor C1, C2 is constituted by a photoemitter E1, E2 and a photoreceiver R1, R2 disposed face-to-face, separated by a movable film 8 with variable opacity the circuit 9' of predictive compensation of the thermal drift is represented in a variation acting on a signal that is not the output signal of the sensor but is representative of the evolution of the output signal. In this case, it acts on the excitation current of the photoemitter that has a unique relation to the output signal of the photoreceiver. Thus, a circuit 9' shown in FIG. 4 receives at the input the signal S2 constituted by the excitation current of the photoemitter E2 and provides on the output an excitation signal S'2 that is treated as above explained in such a manner that the output signal S2 of the photoreceiver R2 is predictively compensated in view of the thermal drift. The compensated signal S'2 is applied through the interruption means 31 to the circuit 9" of the compensation in view of the dark signal, at the input of the photoemitter E2.

The output signal S2 of the photoreceiver R2, predictively compensated in temperature is applied to the input of the circuit 9" of the compensation in view of the dark signal of the receptor R2 the circuit being activated as already illustrated in FIG. 3.

Its output signal S'''2 (reusing the notation of FIG. 3) is then applied to the input of the circuit 16 of the compensation of the drift due to aging and due to the rest of the drift and temperature activated in the already illustrated manner in FIG. 1.

The output signal S'2 (reusing the notation of FIG. 1) is therefore the output signal of the sensor C2 completely compensated in view of the. temperature, the aging, and the dark signal.

Figure 5:
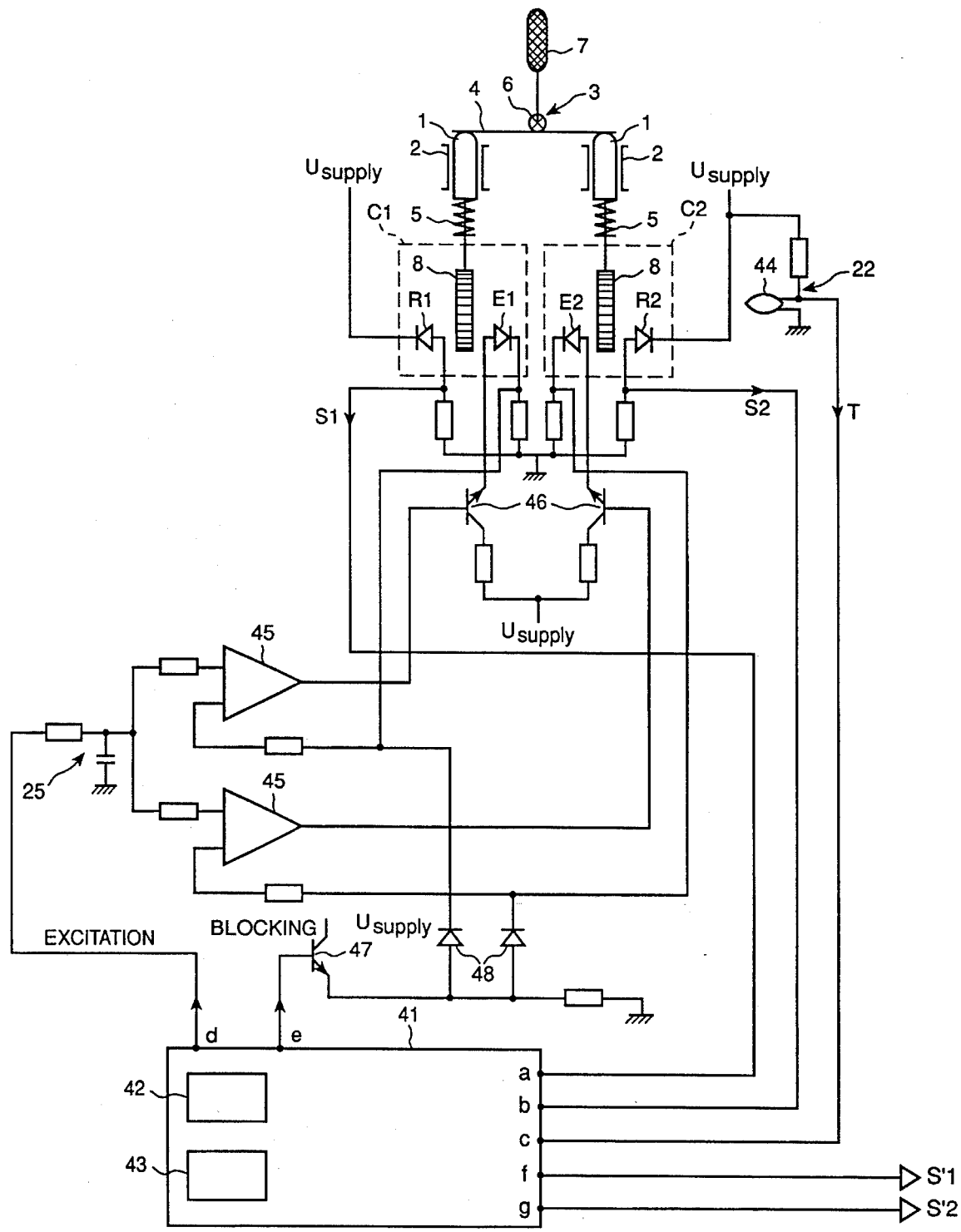
FIG. 5 is an electronic scheme of an embodiment of the circuit of complete compensation of the drifts of FIG. 4.

FIG. 5 is an electric scheme illustrating a specific embodiment of a complete circuit of FIG. 4. Giving consideration to the multiplicity of the functions to be assured, advantageously, a microprocessor circuit 41 is used associated with at least one read only memory 42 destined to memorize the initial data of operation of the manipulator and with at least one random access memory 43 destined to memorize the updated evolutionary data in the course of the operation of the manipulator.

The two photoreceivers R1, R2 are constituted by two photodiodes of which the anode is connected to the ground via a resistor and of which the cathode is connected to a supply voltage source. The output signals S1, S2 are taken at the anode and applied to the two respective inputs a and b of the microprocessor 41.

A unique resistor with negative temperature coefficient 44 is disposed in immediate proximity of the two sensors C1 and C2 and provides unique information of the temperature T that is applied to a third input c of the microprocessor 41. The inputs a, b and c are designated with the same letters as in FIG. 4.

The two photoemitters E1, E2 are constituted by two electroluminiscent diodes (LED) of which the cathodes are connected to the ground via two respective resistors. The two photoemitters E1, E2 are simultaneously excited from a unique output d of the microprocessor delivering a periodic signal modulated in width as a function of variations of the temperature (output of the generator 24 of FIG. 4).

The mean value of the signal is obtained with the help of the filter RC 25 and is applied, as analog compensation signal, to the two respective inputs of the two operational amplifiers 45 being arranged as additional circuits, with their two other respective inputs receiving voltage signals taken from the cathodes of the diodes E1, E2 and representative of the respective currents passing through the diodes, the currents being in a unique manner related to the output levels of the photodiodes R1, R2.

The output signals of the operational amplifiers 45 are applied to proportional current sources constituted by the transistors 46 of which the base receives the regulation signal and that are interposed along their line emitter-collector between a voltage supply source and the anode of the diodes E1, E2, respectively. The assembly constituted by the operational amplifier 45, the transistor 46 and the other associated components form the correction means 26 of the circuit 9' of FIG. 4.

Furthermore, the microprocessor 41 possesses a unique output e to deliver a command signal to inhibit the excitation of the diodes LED E1, E2 and thus the interruption of the optical excitation of the photoreceivers R1, R2. The output e is connected to the base of a transistor 47, mounted as a switch or interrupter, with two blocking diodes 48 interposed between the collector of the transistor 47 and the respective cathodes of the diodes E1, E2. The application of a voltage level to the output e of the microprocessor 41 and hence to the base of the transistor 47 opens the transistor and makes a voltage appear at the anodes of the diodes 47 and the diodes 47 becoming conducting to the cathodes of the LED diodes E1, E2. When their two terminals are held at neighbored potentials, the two LED diodes E1, E2 are not excited and the detection of the dark signal of the photo-diodes R1, R2 can be effected.

Finally, the microprocessor 41 possesses two main output terminals f and g in which respectively the output signals S'1 from the sensor C1, and S'2, from the sensor C2, that are totally compensated in temperature, in aging and in view of the dark signal, and that can serve for a proportional electric control apparatus at the distance, for example for the control of electronic valves in a hydraulic circuit placed under the dependence of the manipulator.

As results from the above mentioned, the invention is not limited to embodiments and modes of application that were more particularly envisioned. On the contrary, it comprises all its variants.

The nominal value signal or compensation signal is in general a compensation signal that is fed into the emitter part of the sensor and compensates for thermal drifts or thermal effects. Incidentally, apart from the dark signal correction, aging effects and smaller temperature drifts and effects are dealt with in the above explained and more accurate auto-calibration method. Thus, for all these effects a misinterpretation of these effects as a change of position of the film is avoided. In a specific embodiment, described above, the compensation signal is formed by taking the mean value of a periodically modulated signal (for example PWM-signal) with a suitable index or degree of modulation corresponding to the temperature. The index of modulation is chosen according to an empirically found functional relation between thermal drift and temperature in a sample sensor.

While the invention has been described in connection with what is presently considered to be the most practical and preferred embodiments, it is to be understood that the invention is not to be limited to the disclosed embodiment, but on the contrary, is intended to cover various modifications and equivalent arrangements included within the spirit and scope of the appended claims.

I claim:

1. A method for compensating an output signal of a photoelectric sensor having a drift due to aging and a drift in temperature, in an electrical proportional remote control apparatus of the manipulation or analog type comprising an actuation member or actuation part for progressive displacement functionally associated with at least one photoelectric sensor adapted to generate an electrical signal of which one parameter is representative of the displacement and/or the position of said actuation member, the method comprising the steps of:

(A) detecting a neutral position of the actuation member wherein said photoelectric sensor is not functionally activated by said actuation member (B) detecting, as a neutral value, the value of a signal that has a unique relation to said output signal of said photoelectric sensor while said sensor is in said neutral position (C) comparing said detected neutral value to an earlier detected neutral value stored in a memory, (D) determining an updated correction factor for said sensor, and (E) when the sensor is again functionally activated by a displacement of the actuation member, correcting with said updated correction factor the signal of said sensor that has a unique relation to the output signal of said sensor in order to obtain an output signal that is compensated as a function of aging and of the temperature.

2. A method according to claim 1, wherein the updated correction factor does not depend on the ratio of the earlier detected neutral value stored in the memory to the detected neutral value.

3. A method according to claim 1, wherein said minimum threshold corresponds to a predetermined value, said value being about 50% of the dynamic of the output signal of said sensor and said second sensor, respectively that is formed by the difference of its stored maximum value and of its stored minimum value.

4. A method according to claim 1, further comprising the steps of:

interrupting the excitation with light of the photo-electric sensor, measuring the dark signal of said photoelectric sensor not excited by light, memorizing said dark signal of said photoelectric sensor, and then, in the course of operation of the photoelectric sensor that is again excited by light, taking into consideration of the dark signal in order to deduce the true output signal of the photoelectric sensor.

5. A method according to claim 4, wherein the electric excitation of the photoelectric sensor is interrupted to interrupt the excitation with light.

6. A method according to claim 1, wherein each photoelectric sensor is subjected to a reasonably homogeneous ambient temperature, said method further comprising the steps of (a1) determining a law of evolution of the drift of the output signal of at least one photoelectric sensor as a function of temperature, wherein this law of evolution is considered as typical law, (a2) establishing, starting from said typical law, and memorizing a law of evolution of an analog compensation signal as a function of the ambient temperature, and (a3) regulating with said analog compensation signal, a signal of said photoelectric sensor that has a unique relation to said output signal of said sensor, said memorized law of evolution being chosen so that the evolution of the analog compensation signal as function of the temperature has such an absolute value and such a sign that it is translated into a variation of the output signal of approximately the same absolute value and opposite sign to that imputed to the thermal drift, whereby the thermal drift of the output signal of the photoelectric sensor is approximately compensated in a predictive manner to obtain an output signal that is approximately thermally compensated in a predictive manner, wherein steps (a1) to (a2) are performed prior to steps (A) to (E).

7. A method according to claim 6, further comprising the following steps, performed after step (a1)

establishing from said typical law and memorizing a law of correspondence between values of the ambient temperature and values of the index of width modulation of a periodic signal modulated in width, in the course of operation of said photoelectric sensor, detecting the ambient temperature at which the photoelectric sensor is set, generating a periodic signal that is modulated in width with the modulation index selected in the memory corresponding to the detected value of the temperature, receiving an analog compensation signal formed by the mean value of said periodic signal modulated in width with said index of modulation selected in correspondence with the ambient temperature, and regulating, with the analog compensation signal, formed in this way, a signal of said photoelectric sensor that has a unique relation to the output signal of the sensor.

8. A method according to claim 6 wherein the excitation signal of the photoelectric sensor that has a unique relation to the output signal of said sensor is regulated using said analog compensation signal.

9. A method according to claim 8, wherein the photoelectric sensor comprises a photoemitter and a photoreceiver optically coupled and wherein the excitation signal of the photoemitter is regulated for compensating predictively the output signal of said photoreceiver.

10. A method for compensating an output signal of a photoelectric sensor having a drift due to aging and a drift in temperature, in an electrical proportional remote control apparatus of the manipulation or analog type comprising sliding pressure sensors pairwise associated and selectively activated starting from an actuation member for progressive displacements, whereby each pressure sensor is functionally associated with a photoelectric sensor adapted to produce an electrical signal of which one parameter is representative of the displacement and/or the position of said pressure sensor and hence of said actuation member, said method comprising the steps of:

(A) detecting, as a neutral value, a minimum threshold of a signal that has a unique relation to the output signal of a first photoelectric sensor associated with one of the pressure sensors activated by a displacement of the actuation member, (B) detecting a value of a signal that has a unique relation to the output signal of the second photoelectric sensor associated with the other pressure sensor that is not activated by the displaced actuation member (C) comparing said detected neutral value with an earlier detected neutral value stored in a memory, (D) deducing an updated correction factor for said second sensor, and (E) when the pressure sensor associated with said second sensor is functionally activated by a displacement of the actuation member, correcting said updated correction factor the signal of said second sensor that has a unique relation to the output signal of said sensor in order to obtain an output signal that is compensated as a function of aging and of the temperature.

11. A method according to claims 1 or 10, wherein the detected value of the output signal of said sensor and of said second photoelectric sensor, respectively, is corrected with the updated correction factor.

12. A method according to claim 10, wherein the updated correction factor does not depend on the ratio of the earlier detected neutral value stored in the memory to the detected neutral value.

13. A method according to claim 10, wherein said minimum threshold corresponds to a predetermined value, said value being about 50% of the dynamic of the output signal of said sensor and said second sensor, respectively, that is formed by the difference of its stored maximum value and of its stored minimum value.

14. A method according to claim 10, further comprising the steps of:

interrupting the excitation with light of the photo-electric sensor, measuring the dark signal of said photoelectric sensor not excited by light, memorizing said dark signal of said photoelectric sensor, and then, in the course of operation of the photoelectric sensor that is again excited by light, taking into consideration of the dark signal in order to deduce the true output signal of the photoelectric sensor.

15. A method according to claim 14, wherein the electric excitation of the photoelectric sensor is interrupted to interrupt the excitation with light.

16. A method according to claim 10, wherein each photoelectric sensor is subjected to a reasonably homogeneous ambient temperature, said method further comprising the steps of:

(a1) determining a law of evolution of the drift of the output signal of at least one photoelectric sensor as a function of temperature, wherein this law of evolution is considered as typical law, (a2) establishing, starting from said typical law and memorizing a law of evolution of an analog compensation signal as a function of the ambient temperature, and (a3) regulating with said analog compensation signal, a signal of said photoelectric sensor that has a unique relation to said output signal of said sensor said memorized law of evolution being chosen so that the evolution of the analog compensation signal as function of the temperature has such an absolute value and such a sign that it is translated into a variation of the output signal of approximately the same absolute value and opposite sign to that imputed to the thermal drift, whereby the thermal drift of the output signal of the photoelectric sensor is approximately compensated in a predictive manner to obtain an output signal that is approximately thermally compensated in a predictive manner, wherein steps (a1) to (a3) are performed prior to steps (A) to (E).

17. A method according to claim 16, further comprising the following steps, performed after step (a1):

establishing from said typical law and memorizing a law of correspondence between values of the ambient temperature and values of the index of width modulation of a periodic signal modulated in width, in the course of operation of said photoelectric sensor, detecting the ambient temperature at which the photoelectric sensor is set, generating a periodic signal that is modulated in width with the modulation index selected in the memory corresponding to the detected value of the temperature, receiving an analog compensation signal formed by the mean value of said periodic signal modulated in width with said index of modulation selected in correspondence with the ambient temperature, and regulating, with the analog compensation signal, formed in this way, a signal of said photoelectric sensor that has a unique relation to the output signal of the sensor.

18. A method according to claim 16, wherein the excitation signal of the photoelectric sensor that has a unique relation to the output signal of said sensor is regulated using said analog compensation signal.

19. A method according to claim 18, wherein the photoelectric sensor comprises a photoemitter and a photoreceiver optically coupled and wherein the excitation signal of the photoemitter is regulated for compensating predictively the output signal of said photoreceiver.

20. A method of total compensation of an output signal of a photoelectric sensor comprising a photoemitter and a photoreceiver optically coupled, wherein:

the output signal of the sensor is approximately thermally compensated in a predictive manner according to the following steps:
(a1) determining a law of evolution of the drift of the output signal of said photoelectric sensor as a function of temperature, wherein this law of evolution is considered as typical law,
(a2) establishing, starting from said typical law, and memorizing a law of evolution of an analog compensation signal as a function of the ambient temperature, and
(a3) regulating with said analog compensation signal, a signal of said photoelectric sensor that has a unique relation to said output signal of said sensor, said memorized law of evolution being chosen so that the evolution of the analog compensation signal as function of the temperature has such an absolute value and such a sign that it is translated into a variation of the output signal of approximately the same absolute value and opposite sign to that imputed to the thermal drift, whereby the thermal drift of the output signal of the photoelectric sensor is approximately compensated in a predictive manner to obtain an output signal that is approximately thermally compensated in a predictive manner;

the predictively compensated signal is compensated to take into consideration the existence of a dark current according to the following steps:
(b1) interrupting the excitation with light of the photoelectric sensor,
(b2) measuring the dark signal of said photoelectric sensor not excited by light,
(b3) memorizing said dark signal of said photoelectric sensor, and then,
(b4) in the course of operation of the photoelectric sensor that is again excited by light, taking into consideration of the dark signal in order to deduce the true output signal of the photoelectric sensor;

and finally the signal is additionally compensated with respect to the drift due to aging and to the rest of the thermal drift according to the following steps:
(c1) detecting a neutral position of the actuation member wherein said photoelectric sensor is not functionally activated by said actuation member.
(c2) detecting, as a neutral value, the value of a signal that has unique relation to said output signal of said photoelectric sensor while said sensor is in said neutral position,
(c3) comparing said detected neutral value to an earlier detected neutral value stored in a memory,
(c4) determining an updated correction factor for said sensor, and,
(c5) when the sensor is again functionally activated by a displacement of the actuation member, correcting with said updated correction factor the signal of said sensor that has a unique relation to the output signal of said sensor in order to obtain an output signal that is compensated as a function of aging and of the temperature.

21. An electronic circuit for compensating an output signal of a photoelectric sensor having a drift due to aging and a drift due to temperature, in a proportional electrical remote control apparatus of the manipulation or analog type comprising an actuation member for the progressive displacement functionally associated with at least one photoelectric sensor adapted to produce an electrical signal of which one parameter is representative of the displacement and/or the position of said actuation member, said electronic circuit comprising:

threshold means for detecting a particular threshold position of the actuation member in which position said at least one photoelectric sensor is not functionally activated detection means for detecting a value of a signal that has a unique relation to an output signal of the photoelectric sensor while said photoelectric sensor is not functionally activated, first memory means for storing a value earlier detected by said detection means and taken as a reference value, determination means for, starting from a detected value of the detection means when said threshold means have detected said threshold and starting from the reference value of the memory means, providing an updated correction factor for the second sensor, second memory means for storing said updated correction factor, and first correction means under the dependance of said second memory means, for correcting a signal that has a unique relation to the output signal of said sensor with said updated correction factor when the sensor is functionally activated by a displacement through the actuation member such that the output signal of the sensor is compensated as a function of aging and of temperature.

22. Compensation circuit according to claim 21, wherein said determination means of the updated correction factor comprises calculating means for calculating a ratio between the earlier detected value, stored in said first memory means and the detected value in a neutral position.

23. An electronic circuit according to claim 21, whereby each photoelectric sensor is subjected to a reasonably homogeneous ambient temperature and wherein the detection means of the output signal of said photoelectric sensor comprises approximately and predictive thermal compensation means comprising:

third memory means for memorizing a law of evolution of an analog compensation signal as a function of the ambient temperature, established from a typical law of evolution of the drift of an output signal of a sample photoelectric sensor as a function of the temperature, and second correction means for correcting with said analog compensation signal a signal that has a unique relation to the output signal of the sensor said stored or memorized law of evolution being chosen in a manner that the evolution of the analog compensation signal as a function of temperature has an absolute value and a sign such that it is translated into a variation of the output signal of the sensor of approximately the same absolute value and opposite sign to that imputed to the thermal drift, in order to obtain an output signal of said sensor which is thermally compensated.

24. An electronic circuit according to claim 23, wherein the approximate and predictive compensation means comprises:

said third memory means adapted to memorize couples of values of ambient temperature and values of the index of width modulation of a periodic signal that is modulated in width established starting from a predetermined law of correspondence that in turn starts from a typical law of evolution of the drift of the output signal of a sample photoelectric sensor as a function of the temperature, detecting means for detecting the ambient temperature to which the photoelectric sensor is subjected, selection means for an index of modulation that are placed under the dependence of said detection means for the temperature and adapted to select in said third memory means a value of the index of modulation corresponding to a detected value of the ambient temperature, generating means for a periodic signal placed under the dependence of said selection means for an index of modulation and adapted to produce a periodic signal modulated in width with said selected index of modulation, treating means for providing an analog compensation signal formed by the mean value of said periodic signal modulated in width in correspondence with the ambient temperature, and said second correction means which are placed under the dependence of said treating means.

25. An electronic circuit according to claim 23 wherein the second correction means acts on the excitation signal of the photoelectric sensor.

26. An electronic circuit according to claim 25, wherein the photoelectric sensor comprises a photoemitter and a photoreceiver optically coupled, and wherein the second correction means act on the excitation current of the photoemitter to compensate predictively the output signal of said photoreceiver.

27. An electronic circuit according to claim 21, wherein the detection means of the output signal of the photoelectric sensor comprises compensation means as a function of a dark current comprising:

interrupting means of the optical excitation activated in order to provoke an interruption of the optical excitation of said photoelectric sensor as long as it is in operation, fourth memory means to retain the value of the output signal of the sensor in the memory as long as the optical excitation of the sensor is interrupted, and third correction means, placed under the dependence of said forth memory means, for correcting in a continuous fashion the output signal of said photoelectric sensor that is again excited with light in the course of operation with said memorized value, in order to provide an output signal compensated in an updated manner as a function of the dark signal.

28. An electronic circuit according to claim 27, wherein the interruption means of the optical excitation comprises electrical interruption means connected to an electrical excitation input of the sensor.

29. An electronic circuit according to claim 27 wherein the third correction means comprises subtraction means adapted to subtract continuously the stored value of the dark signal of the instantaneous value of the output signal of the optically excited sensor, during operation.

30. An electronic circuit for compensating an output signal of a photoelectric sensor which has a drift due to aging and a drift due to the temperature, in a proportional electrical remote control apparatus of the manipulation or analog type comprising sliding pressure sensors pairwise associated and selectively actuated starting from an actuation member for a progressive displacement whereby each pressure sensor is functionally associated with at least a photo-electric sensor adapted to produce an electrical signal of which one parameter is representative of the displacement and/or the position of said actuation member, said electronic circuit comprising:

threshold means for detecting a minimum threshold of a signal that has a unique relation to an output signal of a first sensor associated with a first of said pressure sensors when the latter is activated by a displacement of the actuation member, detection means for detecting the value of a signal that has a unique relation to an output signal of the second photoelectric sensor associated with a second pressure sensor, first memory means for storing in a memory an earlier detected value of said detection means and taken as a reference value, determination means for providing, starting from the detected value by the detection means when said threshold means have detected said threshold and starting from the reference value of the memory means, an updated correction factor for the second sensor, second memory means for storing said updated correction factor, and first correction means placed under the dependence of said second memory means, for correcting a signal that has a unique relation to an output signal of said second sensor with the help of said updated correction factor when the second pressure sensor associated with said second sensor is activated in turn functionally by a displacement through the actuation member, such that the output signal of said second sensor is compensated as a function of aging and of the temperature.

31. An electronic circuit according to claim 21 or 30, wherein the input of the first correction means is connected to the output of the detecting means of the output signal of said photoelectric sensor.

32. Compensation circuit according to claim 30, wherein said determination means of the updated correction factor comprises calculating means for calculating a ratio between the earlier detected value, stored in a memory, in said first memory means and the detected value in a neutral position.

33. An electronic circuit according to claim 30, whereby each photoelectric sensor is subjected to a reasonably homogeneous ambient temperature, and wherein the detection means of the output signal of said photoelectric sensor comprises approximately and predictive thermal compensation means comprising:

third memory means for memorizing a law of evolution of an analog compensation signal as a function of the ambient temperature, established from a typical law of evolution of the drift of an output signal of a sample photoelectric sensor as a function of the temperature, and second correction means for correcting with said analog compensation signal a signal that has a unique relation to the output signal of the sensor, said stored or memorized law of evolution being chosen in a manner that the evolution of the analog compensation signal as a function of temperature has an absolute value and a sign such that it is translated into a variation of the output signal of the sensor of approximately the same absolute value and opposite sign to that imputed to the thermal drift, in order to obtain an output signal of said sensor which is thermally compensated.

34. An electronic circuit according to claim 33, wherein the approximate and predictive compensation means comprises:

said third memory means adapted to memorize couples of values of ambient temperature and values of the index of width modulation of a periodic signal that is modulated in width established starting from a predetermined law of correspondence that in turn starts from a typical law of evolution of the drift of the output signal of a sample photoelectric sensor as a function of the temperature, detecting means for detecting the ambient temperature to which the photoelectric sensor is subjected, selection means for an index of modulation that are placed under the dependence of said detection means for the temperature and adapted to select in said third memory means a value of the index of modulation corresponding to a detected value of the ambient temperature, generating means for a periodic signal placed under the dependence of said selection means for an index of modulation and adapted to produce a periodic signal modulated in width with said selected index of modulation, treating means for providing an analog compensation signal formed by the mean value of said periodic signal modulated in width in correspondence with the ambient temperature, and said second correction means which are placed under the dependence of said treating means.

35. An electronic circuit according to claim 33, wherein the second correction means acts on the excitation signal of the photoelectric sensor.

36. An electronic circuit according to claim 35, wherein the photoelectric sensor comprises a photoemitter and a photoreceiver optically coupled, and wherein the second correction means act on the excitation current of the photoemitter to compensate predictively the output signal of said photoreceiver.

37. An electronic circuit according to claim 30, wherein the detection means of the output signal of the photoelectric sensor comprises compensation means as a function of a dark current comprising:

interrupting means of the optical excitation activated in order to provoke an interruption of the optical excitation of said photoelectric sensor as long as it is in operation, fourth memory means to retain the value of the output signal of the sensor in the memory as long as the optical excitation of the sensor is interrupted, and third correction means, placed under the dependence of said forth memory means, for correcting in a continuous fashion the output signal of said photoelectric sensor that is again excited with light in the course of operation with said memorized value, in order to provide an output signal compensated in an updated manner as a function of the dark signal.

38. An electronic circuit according to claim 37, wherein the interruption means of the optical excitation comprises electrical interruption means connected to an electrical excitation input of the sensor.

39. An electronic circuit according to claim 37, wherein the third correction means comprises subtraction means adapted to subtract continuously the stored value of the dark signal of the instantaneous value of the output signal of the optically excited sensor, during operation.

40. An electronic circuit to assure a complete compensation of the drifts of an output signal of each photoelectric sensor as a function of aging, temperature and dark signal, wherein said circuit comprises:

thermal predictive compensation means comprising:

third memory means for memorizing a law of evolution of an analog compensation signal as a function of the ambient temperature, established from a typical law of evolution of the drift of an output signal of a sample photoelectric sensor as a function of the temperature, and second correction means for correcting with said analog compensation signal a signal that has a unique relation to the output signal of the sensor, said stored or memorized law of evolution being chosen in a manner that the evolution of the analog compensation signal as a function of temperature has an absolute value and a sign such that it is translated into a variation of the output signal of the sensor of approximately the same absolute value and opposite sign to that imputed to the thermal drift, in order to obtain an output signal of said sensor which is thermally compensated, said thermal predictive compensation means connected such that a predictive compensation in the temperature of the output signal of the photoelectric sensor is assured, dark signal compensation means as a function of a dark signal connected in a manner to receive said thermally compensated signal, said dark signal compensation means comprising:

interrupting means of the optical excitation activated in order to provoke an interruption of the optical excitation of said photoelectric sensor as long as it is in operation, fourth memory means to retain the value of the output signal of the sensor in the memory as long as the optical excitation of the sensor is interrupted, and third correction means, placed under the dependence of said forth memory means, for correcting in a continuous fashion the output signal of said photoelectric sensor that is again excited with light in the course of operation with said memorized value, in order to provide an output signal compensated in an updated manner as a function of the dark signal, and aging compensation means as a function of aging and of a rest of thermal drift comprising:

threshold means for detecting a particular threshold position of the actuation member in which position said at least one photoelectric sensor is not functionally activated, detection means for detecting a value of a signal that has a unique relation to an output signal of the photoelectric sensor while said photoelectric sensor is not functionally activated, first memory means for storing a value earlier detected by said detection means and taken as a reference value, determination means for, starting from a detected value of the detection means when said threshold means have detected said threshold and starting from the reference value of the memory means, providing an updated correction factor for the second sensor, second memory means for storing said updated correction factor, and first correction means, under the dependance of said second memory means, for correcting a signal that has a unique relation to the output signal of said sensor with said updated correction factor when the sensor is functionally activated by a displacement through the actuation member such that the output signal of the sensor is compensated as a function of aging and of temperature, said aging compensation means connected to the output of the dark signal compensation means.

41. An electronic circuit according to claim 40, further comprising:

- a microprocessor associated with at least a read only memory containing the initial data and at least a random access memory containing updated evolutionary data,
- detection means for detecting a temperature comprising at least one temperature sensor connected to at least one input of said microprocessor,
- respective outputs of said two photo-electric sensors connected to two other inputs respectively of the microprocessor,
- two excitation inputs of said two photo-electric sensors respectively, and connected to a common excitation output of the microprocessor,
- interruption means adapted to make said two excitation inputs of said two photoelectric sensors that are connected to a common blocking command output of the microprocessor, conducting or not conducting, respectively, and
- two outputs of the microprocessor delivering respectively output signals that are totally compensated associated with the two sensors.

42. An electronic circuit according to claim 40, wherein:

- the excitation output of the microprocessor delivers said periodic signal modulated in width as a function of the temperature,
- this output is connected to a filter circuit for said detection means of the mean value, and
- the output of said filter circuit is connected to two inputs, respectively, of the two additional circuits of which the two other respective inputs receive signals representative of excitation currents of the two photoelectric sensors and of which the respective outputs are connected to the excitation inputs, respectively, of said two photoelectric sensors.

43. A proportional electrical remote control apparatus of the manipulation or analog type comprising sliding pressure sensors pairwise associated and selectively activated starting from an actuation member for progressive displacement, whereby each pressure sensor is functionally associated with a photoelectric sensor adapted to produce an electrical signal of which one parameter is representative for the displacement and/or the position of said pressure sensor and hence of the actuation member, said apparatus equipped with an electronic compensation circuit said electronic compensation circuit comprising:

- threshold means for detecting a particular threshold position of the actuation member in which position said at least one photoelectric sensor is not functionally activated,
- detection means for detecting a value of a signal that has a unique relation to an output signal of the photoelectric sensor while said photoelectric sensor is not functionally activated,
- first memory means for storing a value earlier detected by said detection means and taken as a reference value,
- determination means for, starting from a detected value of the detection means when said threshold means have detected said threshold and starting from the reference value of the memory means, providing an updated correction factor for the second sensor,
- second memory means for storing said updated correction factor, and
- first correction means, under the dependance of said second memory means, for correcting a signal that has a unique relation to the output signal of said sensor with said updated correction factor when the sensor is functionally activated by a displacement through the actuation member such that the output signal of the sensor is compensated as a function of aging and of temperature.

44. A method of total compensation of an output signal of an photoelectric sensor comprising a photoemitter and a photoreceiver optically coupled, wherein:

the output signal of the sensor is approximately thermally compensated in a predictive manner according to the following steps:
- (a1) determining a law of evolution of the drift of the output signal of at least one photoelectric sensor as a function of temperature, wherein this law of evolution is considered as typical law,
- (a2) establishing, starting from said typical law and memorizing a law of evolution of an analog compensation signal as a function of the ambient temperature, and
- (a3) regulating with said analog compensation signal, a signal of said photoelectric sensor that has a unique relation to said output signal of said sensor said memorized law of evolution being chosen so that the evolution of the analog compensation signal as function of the temperature has such an absolute value and such a sign that it is-translated into a variation of the output signal of approximately the same absolute value and opposite sign to that imputed to the thermal drift, whereby the thermal drift of the output signal of the photoelectric sensor is approximately compensated in a predictive manner to obtain an output signal that is approximately thermally compensated in a predictive manner;

the predictively compensated signal is compensated to take into consideration the existence of a dark current according to the following steps:
- (b1) interrupting the excitation with light of the photoelectric sensor,
- (b2) measuring the dark signal of said photoelectric sensor not excited by light,
- (b3) memorizing said dark signal of said photoelectric sensor, and then,
- (b4) in the course of operation of the photoelectric sensor that is again excited by light, taking into consideration of the dark signal in order to deduce the true output signal of the photoelectric sensor;

and finally the signal is additionally compensated with respect to the drift due to aging and to the rest of the thermal drift according to the following steps:
- (c1) detecting, as a neutral value, a minimum threshold of a signal that has a unique relation to the output signal of a first photoelectric sensor associated with one of the pressure sensors activated by a displacement of the actuation member,
- (c2) detecting a value of a signal that has a unique relation to the output signal of the second photoelectric sensor associated with the other pressure sensor that is not activated by the displaced actuation member,
- (c3) comparing said detected neutral value with an earlier detected neutral value stored in a memory,
- (c4) deducing an updated correction factor for said second sensor, and (c5) when the pressure sensor associated with said second sensor is functionally activated by a displacement of the actuation member, correcting said updated correction factor the signal of said second sensor that has a unique relation to the output signal of said sensor in order to obtain an output signal that is compensated as a function of aging and of the temperature.

45. An electronic circuit to assure a complete compensation of the drifts of an output signal of each photoelectric sensor as a function of aging, temperature and dark signal, wherein said circuit comprises:

thermal predictive compensation means comprising:
third memory means for memorizing a law of evolution of an analog compensation signal as a function of the ambient temperature, established from a typical law of evolution of the drift of an output signal of a sample photoelectric sensor as a function of the temperature, and second correction means for correcting with said analog compensation signal a signal that has a unique relation to the output signal of the sensor, said stored or memorized law of evolution being chosen in a manner that the evolution of the analog compensation signal as a function of temperature has an absolute value and a sign such that it is translated into a variation of the output signal of the sensor of approximately the same absolute value and opposite sign to that imputed to the thermal drift, in order to obtain an output signal of said sensor which is thermally compensated, said thermal predictive compensation means connected such that a predictive compensation in the temperature of the output signal of the photoelectric sensor is assured, dark signal compensation means as a function of a dark signal connected in a manner to receive said thermally compensated signal, said dark signal compensation means comprising:
interrupting means of the optical excitation activated in order to provoke an interruption of the optical excitation of said photoelectric sensor as long as it is in operation,
fourth memory means to retain the value of the output signal of the sensor in the memory as long as the optical excitation of the sensor is interrupted, and
third correction means, placed under the dependence of said forth memory means, for correcting in a continuous fashion the output signal of said photoelectric sensor that is again excited with light in the course of operation with said memorized value, in order to provide an output signal compensated in an updated manner as a function of the dark signal, and aging compensation means as a function of aging and of a rest of thermal drift comprising:
threshold means for detecting a minimum threshold of a signal that has a unique relation to an output signal of a first sensor associated with a first of said pressure sensors when the latter is activated by a displacement of the actuation member,
detection means for detecting the value of a signal that has a unique relation to an output signal of the second photoelectric sensor associated with a second pressure sensor,
first memory means for storing in a memory an earlier detected value of said detection means and taken as a reference value,
determination means for providing, starting from the detected value by the detection means when said threshold means have detected said threshold and starting from the reference value of the memory means, an updated correction factor for the second sensor,
second memory means for storing said updated correction factor, and
first correction means placed under the dependence of said second memory means, for correcting a signal that has a unique relation to an output signal of said second sensor with the help of said updated correction factor when the second pressure sensor associated with said second sensor is activated in turn functionally by a displacement through the actuation member, such that the output signal of said second sensor is compensated as a function of aging and of the temperature, said aging compensation means connected to the output of the dark signal compensation means.

46. An electronic circuit according to claim 45, further comprising:
a microprocessor associated with at least a read only memory containing the initial data and at least a random access memory containing updated evolutionary data,
detection means for detecting a temperature comprising at least one temperature sensor connected to at least one input of said microprocessor,
respective outputs of said two photo-electric sensors connected to two other inputs respectively of the microprocessor,
two excitation inputs of said two photo-electric sensors, respectively, and connected to a common excitation output of the microprocessor,
interruption means adapted to make said two excitation inputs of said two photoelectric sensors that are connected to a common blocking command output of the microprocessor, conducting or not conducting, respectively, and
two outputs of the microprocessor delivering respectively output signals that are totally compensated associated with the two sensors.

47. An electronic circuit according to claim 45, wherein: the excitation output of the microprocessor delivers said periodic signal modulated in width as a function of the temperature, this output is connected to a filter circuit for said detection means of the mean value, and the output of said filter circuit is connected to two inputs, respectively, of the two additional circuits of which the two other respective inputs receive signals representative of excitation currents of the two photoelectric sensors and of which the respective outputs are connected to the excitation inputs, respectively, of said two photoelectric sensors.

* * * * *